(12) United States Patent
Lee et al.

(10) Patent No.: US 12,630,762 B2
(45) Date of Patent: May 19, 2026

---

(54) HYBRID WAVELENGTH CONVERTER, METHOD FOR MANUFACTURING SAME, AND LIGHT EMITTING DIODE COMPRISING SAME

(71) Applicant: SEOUL NATIONAL UNIVERSITY R&DB FOUNDATION, Seoul (KR)

(72) Inventors: Tae-Woo Lee, Seoul (KR); Jin Woo Park, Seoul (KR)

(73) Assignee: SEOUL NATIONAL UNIVERSITY R&DB FOUNDATION, Seoul (KR)

( * ) Notice: Subject to any disclaimer, the term of this patent is extended or adjusted under 35 U.S.C. 154(b) by 1057 days.

(21) Appl. No.: 17/631,856

(22) PCT Filed: Apr. 28, 2020

(86) PCT No.: PCT/KR2020/005608
§ 371 (c)(1),
(2) Date: Aug. 1, 2022

(87) PCT Pub. No.: WO2021/020695
PCT Pub. Date: Feb. 4, 2021

(65) Prior Publication Data
US 2022/0389312 A1     Dec. 8, 2022

(30) Foreign Application Priority Data

Jul. 30, 2019     (KR) ........................ 10-2019-0092292

(51) Int. Cl.
*C09K 11/61*     (2006.01)
*C09K 11/63*     (2006.01)
(Continued)

(52) U.S. Cl.
CPC .......... *C09K 11/615* (2013.01); *C09K 11/632* (2013.01); *G02B 5/206* (2013.01);
(Continued)

(58) Field of Classification Search
CPC ...... C09K 11/615; C09K 11/632; G02B 5/206
(Continued)

(56)                References Cited

U.S. PATENT DOCUMENTS 6,013,979 A *     1/2000     Picht .................... C09K 11/615
                                                            313/469
2010/0051898 A1*   3/2010     Kim ........................ C09K 11/62
                                                            977/774
(Continued)

FOREIGN PATENT DOCUMENTS

KR     20100027892 A     3/2010
KR     20160054735 A *   5/2016   .......... C09K 11/025
(Continued)

OTHER PUBLICATIONS

International Search Report for PCT/KR2020/005608 mailed Feb. 17, 2021.

*Primary Examiner* — Stephone B Allen
*Assistant Examiner* — Boutsikaris Leonidas
(74) *Attorney, Agent, or Firm* — Wenderoth, Lind & Ponack, L.L.P.

(57)                ABSTRACT

The present inventive concept relates to a hybrid wavelength converter including both a metal halide perovskite nanocrystal particles and non-perovskite-based quantum dots or non-perovskite-based phosphors converting a wavelength of light generated from an excitation light source to specific wavelengths, and a light-emitting device including the same. By including metal halide perovskite nanocrystal particles and non-perovskite quantum dots or non-perovskite phosphors in the dispersion medium, the hybrid wavelength converter according to the present inventive concept enables to make simultaneous wavelength conversion to red and green light, and to be optically stable and improved color purity and luminescence performance without changing the
(Continued)

emission wavelength range even with a lower cadmium content than the conventional quantum dot wavelength converter.

17 Claims, 6 Drawing Sheets

(51) Int. Cl.

| | |
|---|---|
| *G02B 5/20* | (2006.01) |
| *B82Y 20/00* | (2011.01) |
| *H01S 5/026* | (2006.01) |
| *H10H 20/851* | (2025.01) |

(52) U.S. Cl.

CPC ......... *B82Y 20/00* (2013.01); *G02B 2207/101* (2013.01); *H01S 5/026* (2013.01); *H10H 20/8513* (2025.01)

(58) Field of Classification Search

USPC ......................................................... 359/589

See application file for complete search history.

(56) References Cited

U.S. PATENT DOCUMENTS

2022/0381406 A1* 12/2022 Dursun ................ C09K 11/883
2023/0197910 A1* 6/2023 Lee ........................ C09K 11/06
257/98

FOREIGN PATENT DOCUMENTS

| KR | 20160055090 A | | 5/2016 | |
|---|---|---|---|---|
| KR | 20190008885 A | * | 1/2019 | .............. H01S 5/34 |
| KR | 20190055393 A | | 5/2019 | |

* cited by examiner

HYBRID WAVELENGTH CONVERTER, METHOD FOR MANUFACTURING SAME, AND LIGHT EMITTING DIODE COMPRISING SAME

TECHNICAL FIELD

The present inventive concept relates to a hybrid wavelength converter, a manufacturing method thereof, a light-emitting device including the same, and more particularly, to a hybrid wavelength converter including metal halide perovskite nanocrystal particles, non-perovskite-based quantum dots and dispersion medium, and a manufacturing method thereof.

BACKGROUND ART

A light-emitting diode (LED) is a semiconductor device that converts current into light and is mainly used as a light source for a display device. These light-emitting diodes are very small compared to conventional light sources, exhibit very excellent characteristics such as low power consumption, long lifespan, and fast response speed. In addition, harmful electromagnetic waves such as ultraviolet rays are not emitted, and mercury and other discharge gases are not used, thereby being environmentally friendly. The light-emitting device is mainly formed through a combination with a light-emitting diode light source using wavelength converting particles such as a phosphor.

These wavelength converting particles differ from phosphors of general semiconductor materials in that they can be used in light-emitting devices in the form of being combined with excitation light sources. The wavelength converting particles serve to convert the wavelength of the light source of the light-emitting diode into a wavelength of lower energy. Therefore, it is possible to perform a function of converting the emitting wavelength of a monochromatic light-emitting diode into multiple wavelengths to emit their light simultaneously or inducing white light by using wavelength converting particles. In addition, desirably, the wavelength converting particles having excellent color purity characteristics can serve to effectively improve the low color reproduction range of the existing light-emitting device which is difficult to implement vivid colors.

Conventionally, quantum dots have been used as these wavelength converting particles. The quantum dots generate light stronger than conventional phosphors in a narrow wavelength range. The emission of quantum dots occurs when electrons in an excited state transit from the conduction band to the valence band, and even in the case of the same material, the wavelength varies depending on the particle size. The smaller the size of the quantum dot, the shorter the wavelength of light is emitted, so that light in the desired wavelength range can be obtained by adjusting the size.

Quantum dots emit light even if they randomly select excitation wavelengths, so light of various colors can be observed at once even if they are excited by one wavelength when several types of quantum dots exist. In addition, quantum dots transit only from the ground vibrational state of the conduction band to the ground vibrational state of the valence band, so the emission wavelength is almost monochromatic.

The quantum dots are nanocrystals of a semiconductor material with a diameter of about 10 nm, and as a method of synthesizing the quantum dots, vapor deposition of producing quantum dots by MOCVD (metal organic chemical vapor deposition) or MBE (molecular beam epitaxy), or chemical wet method by adding a precursor material to an organic solvent to grow crystals is used. The chemical wet method is a method of controlling the growth of crystals by naturally coordinating the organic solvent on the surface of the quantum dot crystal to serve as a dispersant when crystals are grown and has an advantage of controlling uniformity of the size and shape through easier and cheaper processes than vapor deposition such as MOCVD or MBE.

However, cadmium (Cd) used in synthesis is very harmful to the human body and can only be used at less than 100 ppm after 2022 according to the Restriction of Hazardous Substances Directive (RoHS) standard. In addition, quantum dots still have limited color purity and luminescence performance In particular, in the case of quantum dots without cadmium, color purity is very low in which the full width at half maximum (FWHM) is 35 nm or more. In terms of price, quantum dots that emit light depending on the size cost a lot of money to synthesize even-sized quantum dots, and semiconductor materials that make up quantum dots are very expensive. In addition, due to the low absorbance of the quantum dots, a large amount of quantum dots is required to produce the wavelength converter, so there is a problem of cost increase. Therefore, there is an urgent need to develop a wavelength converter with weak toxicity, more stable, and superior light-emitting characteristics.

Meanwhile, the metal halide perovskite does not contain cadmium, and the emission wavelength may be adjusted by controlling the halide ions of X in the structure of $ABX_3$, $A_2BX_4$, $A_4BX_6$, $ABX_4$, or $A_{n-1}B_nX_3$. In addition, since it has a greater absorbance than conventional quantum dots, it is possible to secure equal or higher efficiency characteristics by using only a smaller amount of light emitters than conventional quantum dots.

However, halide ions in metal halide perovskites have very high mobility, which can lead to halide ion migration. Accordingly, when metal halide perovskite nanoparticles having different halide ion compositions are used in wavelength converters, the composition of metal halide perovskite nanoparticles is changed by ion migration, and thus the light-emitting wavelength range of the wavelength converter may be easily changed. Therefore, it is very difficult to obtain stable light emission of two or more wavelengths with a wavelength converter using metal halide perovskites.

In addition, in a wavelength converter using only metal halide perovskite nanocrystal particles, energy transfer among them may occur spontaneously due to high absorbance of metal halide perovskite nanoparticles, thereby changing the emission wavelength range. In addition, aggregation of metal halide perovskite nanocrystal particles may occur due to high reactivity of metal halide perovskites, thereby reducing luminescence efficiency.

Therefore, there is still a need to develop a wavelength converter that reduces the amount of cadmium used, is economical, and exhibits excellent luminescence characteristics.

DISCLOSURE

Technical Problem

Accordingly, the present inventive concept has been devised to solve the above problems, and the first object of the present inventive concept is to provide a hybrid wavelength converter that is optically stable and exhibits excellent emission characteristics without changing the emission wavelength range even with low cadmium content.

A second object of the present inventive concept is to provide a method of manufacturing the hybrid wavelength converter.

A third object of the present inventive concept is to provide a light-emitting device including the hybrid wavelength converter.

Technical Solution

To achieve the first object, the present inventive concept provides metal halide perovskite nanocrystal particles as the first wavelength converting particle to convert the wavelength of light generated from the excitation light source into a specific wavelength; non-perovskite-based quantum dot as the second wavelength converting particle to convert the wavelength of light generated from the excitation light source into a specific wavelength; and a hybrid wavelength converter comprising a dispersion medium for dispersing the metal halide perovskite nanocrystal particles and the non-perovskite-based quantum dots.

In addition, the present inventive concept provides metal halide perovskite nanocrystal particles as the first wavelength converting particle to convert the wavelength of light generated from the excitation light source into a specific wavelength; non-perovskite-based phosphor as the second wavelength converting particle to convert the wavelength of light generated from the excitation light source into a specific wavelength; and a hybrid wavelength converter comprising a dispersion medium for dispersing the metal halide perovskite nanocrystal particles and the non-perovskite-based phosphor.

Further, preferably, the hybrid wavelength converter may further comprise a sealing element for sealing a dispersion medium in which the metal halide perovskite nanocrystal particles and the non-perovskite-based quantum dots or non-perovskite-based phosphor are dispersed.

Furthermore, desirably, the metal halide perovskite nanocrystal particles and the non-perovskite-based quantum dots may be mixed by arbitrarily selecting the upper and lower limits of the weight ratios of 0.5:1, 1:1, 1.1:1, 1.3:1, 1.4:1, 1.5:1, 1.6:1, 1.7:1, 1.8:1, 1.9:1, 2.0:1, 3:1, and 5:1.

Further, preferably, the metal halide perovskite nanocrystal particles and the non-perovskite-based quantum dots can convert the wavelength of light generated from the excitation light source into different wavelengths.

Further, preferably, upon irradiating blue light generated from the excitation light source, the metal halide perovskite nanocrystal particles emit green light, and the non-perovskite-based quantum dots may emit red light.

Further, preferably, the metal halide perovskite nanocrystal particles may further include a plurality of organic ligands surrounding the nanocrystals in the metal halide perovskite nanocrystal particles, and may be dispersed in an organic solvent.

Further, preferably, the metal halide perovskite nanocrystal particles may include a structure of $A_2BX_4$, $ABX_4$, $ABX_3$, or $A_{n-1}B_nX_{3n+1}$ (n is an integer between 2 and 6), wherein A is organic ammonium, B may be a metal material, and X may be a halogen element.

Further, preferably, the size of the metal halide perovskite nanocrystal particles can be 1 nm to 900 nm, and the band gap energy can be 1 eV to 5 eV.

Further, preferably, the non-perovskite-based quantum dot may include at least one of a Si-based nanocrystal, a group II-IV-based compound semiconductor nanocrystal, a group III-V-based compound semiconductor nanocrystal, a group IV-V-based compound semiconductor nanocrystal, a boron quantum dot, a carbon quantum dot, a metal quantum dot, and a mixture thereof.

Further, preferably, the dispersion medium may be at least one of an epoxy resin, silicon, and a mixture thereof.

Further, desirably, the sealing element may be at least one of epoxy resin, acrylic polymer, glass, carbonate polymer, silicon, and mixtures thereof.

In addition, in order to achieve the second object, the present inventive concept provides a method of manufacturing a hybrid wavelength converter that includes a step of producing a first dispersion solution by mixing metal halide perovskite nanocrystal particles as wavelength converting particles in a dispersion solvent with a non-perovskite-based nanocrystal particles or a non-perovskite-based phosphor; a step of preparing a second dispersion solution by mixing a dispersion medium with the first dispersion solution; and a step of forming a hybrid wavelength converter by coating the second dispersion solution on a substrate and irradiating ultraviolet rays to polymerize and cure the dispersion medium.

In addition, the present inventive concept provides a method of manufacturing a hybrid wavelength converter that includes a step of preparing a metal halide perovskite precursor solution by dissolving a metal halide perovskite precursor in a solvent; a step of preparing a third dispersion solution by mixing non-perovskite-based quantum dots and a dispersion medium with the metal halide perovskite precursor solution; and a step of forming a hybrid wavelength converter by coating the third dispersion solution on a substrate to crystallize and irradiating ultraviolet rays to polymerize and cure the dispersion medium.

In addition, the present inventive concept provides a method of manufacturing a hybrid wavelength converter that includes a step of laminating the first sealing element and the second sealing element; a step of bonding (or adhering) one side of the first sealing element and the second sealing element; a step of injecting a dispersion medium, in which metal halide perovskite nanocrystal particles and non-perovskite-based quantum dots are dispersed as wavelength converting particles, between the first sealing element and the second sealing element through the other side to which the first sealing element and the second sealing element are not adhered (or bonded); and a step of sealing the dispersion medium in which metal halide perovskite nanocrystal particles and non-perovskite-based quantum dots are dispersed as wavelength converting particles by adhering the other side of the first sealing element and the second sealing element is sealed with a sealing element.

In addition, in order to achieve the third object, the present inventive concept provides a light-emitting device that includes a base structure; at least one excitation light source emitting light of a predetermined wavelength disposed on the base structure; and a hybrid wavelength converter that converts a wavelength of light generated from the excitation light source into a specific wavelength disposed in the optical path of the excitation light source, in which the hybrid wavelength converter includes metal halide perovskite nanocrystal particles as first wavelength converting particles that convert the wavelength of light generated from the excitation light source into a specific wavelength, non-perovskite quantum dots as second wavelength converting particles that convert a wavelength of light generated from an excitation light source into a specific wavelength, and a dispersion medium for dispersing the metal halide perovskite nanocrystal particles and the non-perovskite-based quantum dots, in which the metal halide perovskite nanocrystal particles and non-perovskite quantum dots are characterized by converting the wavelength of light generated from an excitation light source into different wavelengths.

In addition, the present inventive concept includes a base structure; at least one excitation light source emitting light of a predetermined wavelength disposed on the base structure; and a hybrid wavelength converter that converts the wavelength of light generated from the excitation light source into a specific wavelength. The hybrid wavelength converter includes metal halide perovskite nanocrystal particles as first wavelength converting particles for converting the wavelength of light generated from the excited light source into a specific wavelength, non-perovskite-based phosphor as a second wavelength converting particle that converts a wavelength of light generated from an excitation light source into a specific wavelength, and dispersion medium for dispersing the metal halide perovskite nanocrystal particles and the non-perovskite-based phosphor. The metal halide perovskite nanocrystal particles and the non-perovskite-based phosphor provides a light-emitting device characterized in that light generated from an excitation light source is converted into lights with different wavelengths.

Further, preferably, the hybrid wavelength converter may comprise a sealing element for sealing a dispersion medium in which the metal halide perovskite nanocrystal particles and the non-perovskite-based quantum dots or non-perovskite-based phosphor are dispersed.

Further, preferably, the excitation light source is a light-emitting diode or a laser diode, and may emit blue light.

Also, preferably, the light-emitting device may further include: a groove part including a bottom surface on which the excitation light source is to be mounted and a side surface on which a reflective part is formed; and a support part supporting the groove part and having an electrode part electrically connected to the excitation light source.

Advantageous Effects

The hybrid wavelength converter according to the present inventive concept may simultaneously include metal halide perovskite nanocrystal particles and a non-perovskite-based quantum dot or a non-perovskite-based phosphor, thereby wavelength conversion to red light and green light is possible simultaneously by a single excitation light and instability of a light emitting wavelength range due to halide ion migration and aggregation can be overcome. By controlling the mixing ratio of the metal halide perovskite nanocrystal particles and the non-perovskite-based quantum dots, even with a lower cadmium content and light emitter content than conventional quantum dot wavelength converters, it is possible to produce the wavelength converter that is optically stable and has excellent color purity and light emitting performance without changing the light emitting wavelength range.

DESCRIPTION OF DRAWINGS

FIG. 3 is a schematic diagram illustrating a method for manufacturing metal halide perovskite nanocrystal particles used in a hybrid wavelength converter according to an embodiment of the present inventive concept.

FIG. 5 is a cross-sectional view of a light-emitting device including a hybrid wavelength converter according to an embodiment of the present inventive concept.

FIG. 6 is a cross-sectional view of a light-emitting device including a hybrid wavelength converter according to another embodiment of the present inventive concept.

MODES OF THE INVENTIVE CONCEPT

Figures 1, 2:
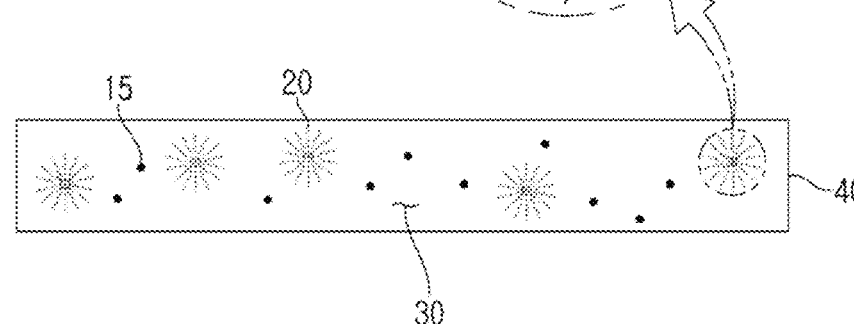
FIG. 1 is a schematic diagram illustrating a hybrid wavelength converter according to an embodiment of the present inventive concept.
FIG. 2 is a schematic diagram illustrating a hybrid wavelength converter according to another embodiment of the present inventive concept.

Hereinafter, in order to describe the present inventive concept in more detail, a preferred embodiment according to the present inventive concept will be described in more detail with reference to the accompanying drawings. However, the present inventive concept is not limited to the embodiments described herein and may be embodied in other forms. The same reference numerals throughout the specification represent the same components.

<Hybrid Wavelength Converter>

FIG. 1 illustrates a hybrid wavelength converter according to an embodiment of the present inventive concept.

Referring to FIG. 1, a hybrid wavelength converter 400 according to an embodiment of the present inventive concept includes metal halide perovskite nanocrystal particles 20, non-perovskite-based quantum dots 15, and a dispersion medium 30.

When light (incident light) incident from the outside reaches the metal halide perovskite nanocrystal particles, wavelength-converted light is emitted. Accordingly, the hybrid wavelength converter 400 according to the present inventive concept functions to convert wavelengths of light by metal halide perovskite nanocrystal particles and non-perovskite-based quantum dots.

In this case, light having a wavelength shorter than the emission wavelength of the metal halide perovskite nanocrystal particles described above is referred to as excitation light. In addition, the light source emitting the above-described excitation light is referred to as an excitation light source.

The hybrid wavelength converter according to the present inventive concept simultaneously comprises metal halide perovskite nanocrystal particles 20 having a lamellar structure in which an organic plane and an inorganic plane are alternately stacked and non-perovskite-based quantum dot 15 as wavelength converting particles.

In addition, the hybrid wavelength converter according to the present inventive concept may simultaneously include the metal halide perovskite nanocrystal particles 20 and the non-perovskite-based phosphor described above.

In the present inventive concept, the non-perovskite-based wavelength converter may be classified into quantum dots and phosphor. The quantum dots are semiconductor particles having a size of several nanometers or less, and have a diameter smaller than a Bohr radius, thereby exhibiting a quantum confinement effect. Therefore, the smaller the size of the quantum dot, the larger the bandgap energy, and the emission wavelength may be adjusted according to the size of the quantum dot. On the other hand, a phosphor has a diameter larger than the Bohr radius, so the bandgap energy does not change depending on the size of particles or crystals, and the phosphor refers to a material that emits light depending on a crystal structure or a molecular structure.

In the hybrid wavelength converter according to the present inventive concept, hereinafter, a non-perovskite-based quantum dot will be mainly described as an example of the non-perovskite-based wavelength converter, but the present inventive concept is not limited thereto, and the non-perovskite-based phosphor is also included in the scope of the present inventive concept.

Conventional metal halide perovskite nanoparticles may adjust the emission wavelength by controlling the halide ion of X in general in the structure of $ABX_3$, $A_2BX_4$, $A_4BX_6$, $ABX_4$, or $A_{n-1}B_nX_3$. However, since the halide ions of the metal halide perovskite have very large mobility, halide ion migration may occur. Accordingly, when metal halide perovskite nanoparticles having different halide ion compositions are used in wavelength converters, the composition of metal halide perovskite nanoparticles is changed by ion migration, and thus the light-emitting wavelength range of the wavelength converter may be easily changed. Therefore, it is very difficult to obtain stable light emission of two or more wavelengths with a wavelength converter using only metal halide perovskites. In addition, due to the high reactivity of the metal halide perovskites, aggregation of the metal halide perovskite nanoparticles may occur, and luminescence efficiency may be reduced.

In addition, inorganic quantum dots used as conventional wavelength converters necessarily includes cadmium (Cd) for color purity and light emission performance, and the cadmium is very harmful to the human body and can only be used under 100 ppm after 2022 according to the Restriction of Hazardous Substances Directive (RoHS) standard. In the case of quantum dots without cadmium, the color purity is very low with a FWHM of 35 nm or more. In addition, semiconductor materials constituting quantum dots are very expensive, and a large amount of quantum dots are required for the production of wavelength converters due to the low absorbance of quantum dots, so there is a problem of cost increase.

However, the hybrid wavelength converter according to the present inventive concept can significantly lower the cadmium content in the wavelength converter by replacing some of the inorganic quantum dot wavelength converters, one of the conventional non-perovskite quantum dots, with metal halide perovskite nanoparticles containing no cadmium. This is very important commercially because it can not only reduce the harmfulness of the wavelength converter but also allow the wavelength converter to satisfy the RoHS criteria. In particular, since the metal halide perovskite nanocrystal particles have a greater absorbance than the inorganic quantum dots, only a smaller amount of light emitters may be used to ensure equal or more efficiency characteristics than conventional inorganic quantum dots.

In addition, in the hybrid wavelength converter according to the present inventive concept, the non-perovskite-based quantum dot does not contain halide ions. Therefore, halide ion migration does not occur between non-perovskite quantum dots and metal halide perovskite nanocrystal particles. Accordingly, the composition of the metal halide perovskite nanocrystal particles is not changed in the hybrid wavelength converter according to the present inventive concept, and thus the metal halide perovskite nanocrystal particles may obtain stable emission without changing the emission wavelength range.

Accordingly, the hybrid wavelength converter according to the present inventive concept is essentially different from the conventional non-perovskite wavelength converter or the metal halide perovskite wavelength converter, and is a more advanced wavelength converter.

The metal halide perovskite nanocrystal particles and the non-perovskite-based quantum dot may convert light generated from an excitation light source into different wavelengths. Specifically, when blue light generated from the excitation light source is irradiated, the metal halide perovskite nanocrystal particles emit green light and the non-perovskite-based quantum dots may emit red light. In this case, the green light has a wavelength range of 510 nm to 650 nm, and the red light has a wavelength range of 600 nm to 670 nm.

When metal halide perovskite nanocrystals emit green light and non-perovskite quantum dots emit red light, excitation light can be effectively converted into green light due to high absorbance of metal halide perovskite nanocrystals, and energy transition can be induced from perovskite nanocrystals to non-perovskite quantum dots. Therefore, compared to conventional non-perovskite quantum dot wavelength converters, it is possible to secure equal or higher efficiency properties with a smaller amount of light emitter and effectively reduce self-energy transition of metal halide perovskite nanoparticles to obtain stable light emission.

In the hybrid wavelength converter according to the present inventive concept, since the metal halide perovskite nanocrystal particles and the non-perovskite-based quantum dot are different types of wavelength converting particles, there is a large difference in characteristics in absorption and emission with a function of wavelength. In addition, metal halide perovskites have very large absorbance. Therefore, it is difficult to adjust the mixing ratio compared to conventional quantum dot wavelength converters. Accordingly, in the hybrid wavelength converter according to the present inventive concept, it is important to adjust the mixing ratio of the metal halide perovskite nanocrystal particles and the non-perovskite-based quantum dot so that the level of emission of green light and red light is equal.

In this case, a mixing ratio of the metal halide perovskite nanocrystal particles and the quantum dots may be performed by arbitrarily selecting an upper limit and a lower limit among weight ratios of 0.5:1, 1:1, 1.2:1, 1.4:1, 1.5:1, 1.6:1, 1.7:1, 1.8:1, 1.9:1, 2.0:1, 3:1, and 5:1. Preferably, the metal halide perovskite nanocrystal particles and the non-perovskite-based quantum dot may be mixed in a weight ratio of 1:1 to 2:1. When the mixing ratio of the metal halide perovskite nanocrystal particles is out of the above range, aggregation of the metal halide perovskite may occur, and thus stable wavelength conversion may not be performed, and luminescence efficiency may be greatly reduced or wavelength may change.

In the hybrid wavelength converter according to the present inventive concept, the metal halide perovskite nanocrystal particle 20 may include a structure of $ABX_3$, $A_2BX_4$, $ABX_4$, or $A_{n-1}B_nX_{3n+1}$ (n is an integer between 2 and 6). A is an organic ammonium material, B is a metal material, and X is a halogen element. For example, A can be $(CH_3NH_3)_n$, $((C_xH_{2x+1})_nNH_3)_2(CH_3NH_3)n$, $(RNH_3)_2$, $(C_nH_{2n+1}NH_3)_2$, $(CF_3NH_3)$, $(CF_3NH_3)_n$, $((C_xF_{2x+1})_nNH_3)_2$ $(CF_3NH_3)_n$, $((C_xF_{2x+1})_nNH_3)_2$ or $(C_nF_{2n+1}NH_3)_2$ (n is an integer greater than or equal to 1). B can be a divalent transition metal, a rare earth metal, an alkaline earth metal, Pb, Sn, Ge, Ga, In, Al, Sb, Bi, Po, or a combination of them. In this case, the divalent rare earth metal may be, for example, Ge, Sn, Pb, Eu, or Yb. In addition, the alkaline earth metal may be, for example, Ca or Sr. In addition, X may be Cl, Br, I, or a combination thereof.

Meanwhile, the metal halide perovskite nanocrystal particles 20 may further include a plurality of organic ligands 22 surrounding the nanocrystal 21 in the metal halide perovskite nanocrystal particles, and may be dispersed in an organic solvent. In this case, the organic ligands 22 may include alkyl halide as a material used as a surfactant. Accordingly, as described above, the alkyl halide used as a surfactant to stabilize the surface of the metal halide perovskite nanocrystal 21 becomes an organic ligand 22 surrounding the surface of the metal halide perovskite nanocrystal 21.

On the other hand, if the length of the alkyl halide surfactant is short, the size of the nanocrystal formed is increased and thus may be formed to exceed 900 nm, and in this case, there may be a fundamental problem in which excitons are separated into free charges and dissipated due to thermal ionization and delocalization of charge carriers in large nanocrystals.

That is, the size of the metal halide perovskite nanocrystal particles formed are inversely proportional to the length of the alkyl halide surfactant used to form such nanocrystals.

Accordingly, the size of the metal halide perovskite nanocrystal particles formed by using alkyl halide having a predetermined length or more as a surfactant may be controlled to be equal to or less than a predetermined size. For example, metal halide perovskite nanocrystal particles having a size of 1 nm to 900 nm may be formed by using octadecylammonium bromide as an alkyl halide surfactant.

The band gap of the metal halide perovskite nanocrystal particles may be adjusted by substitution of a halogen element. The bandgap energy of the nanocrystal may be 1 eV to 5 eV.

The non-perovskite-based quantum dot 15 may be at least one of Si-based nanocrystals, group II-IV-based compound semiconductor nanocrystals, group III-V-based compound semiconductor nanocrystals, group IV-VI-based compound semiconductor nanocrystals, boron quantum dots, carbon quantum dots, metal quantum dots, and mixtures thereof. Any one nanocrystal may be included.

The group II-IV-based compound semiconductor nanocrystal may be any one selected from the group consisting of CdS, CdSe, CdTe, ZnS, ZnSe, ZnTe, HgS, HgSe, HgTe, CdSeS, CdSeTe, CdTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, CdZnSeS, CdZnSeTe, CdZnSTe, CdHgSeS, CdHgSeTe, CdHgSTe, HgZnSeS, HgZnSeTe, and HgZnSTe, but is not limited thereto.

The group III-V-based compound semiconductor nanocrystal may be any one selected from the group consisting of GaN, GaP, GaAs, AlN, AlP, AlAs, InN, InP, InAs, GaNP, GaNAs, GaPAs, AlNP, AlNAs, AlPAs, InNP, InNAs, InPAs, GaAlNP, GaAlNAs, GaAlPAs, GaInNP, GaInNAs, GaInPAs, InAlNP, InAlNAs, and InAlPAs, but is not limited thereto.

The group IV-VI-based compound semiconductor nanocrystal may be SbTe, but is not limited thereto.

The carbon quantum dot may be a graphene quantum dot, a carbon quantum dot, a $C_3N_4$ alternating array quantum dot, or a polymer quantum dot, but is not limited thereto.

The metal quantum dot may be Au, Ag, Al, Cu, Li, Cu, Pd, Pt, or an alloy thereof, but is not limited thereto.

In the hybrid wavelength converter according to the present inventive concept, the dispersion medium may be in a liquid state, uniformly disperses the metal halide perovskite nanoparticles and the non-perovskite-based quantum dots, and is cured during ultraviolet irradiation to immobilize the metal halide perovskite nanoparticles and the non-perovskite-based quantum dot. The dispersion medium may be at least one of an epoxy resin, silicon, and a mixture thereof, but is not limited thereto.

FIG. 2 is a schematic diagram illustrating a hybrid wavelength converter according to another embodiment of the present inventive concept.

Referring to FIG. 2, the hybrid wavelength converter 400 according to another embodiment of the present inventive concept may further include a sealing element 10 sealing the dispersion medium in metal halide perovskite nanocrystal particle 20, non-perovskite-based quantum dots 15, and dispersion medium 30.

In addition, the hybrid wavelength converter according to another embodiment of the present inventive concept may further include a sealing element sealing the dispersion medium in metal halide perovskite nanocrystal particles, a non-perovskite-based phosphor, and a dispersion medium.

The sealing element 10 may be a material that is not corroded by a dispersion medium, in which metal halide perovskite nanocrystal particles, non-perovskite-based quantum dots or non-perovskite phosphors are dispersed, and may be desirably at least one of epoxy resin, acrylic polymer, glass, carbonate-based polymer, silicon, and a mixture thereof. For example, since the polymer resin can be heated and adhered, using this characteristic, a pack, in which metal halide perovskite nanocrystal particles and non-perovskite-based quantum dots are dispersed, may be formed by thermal adhesion using the sheet-state polymer resin as a sealing material. A manufacturing method of a hybrid wavelength converter 400 using such a sealing element will be described in detail in the following <Manufacturing method of a hybrid wavelength converter>.

<Manufacturing Method of a Hybrid Wavelength Converter>

Hereinafter, a method of manufacturing a hybrid wavelength converter according to the present inventive concept will be described.

First, metal halide perovskite nanocrystal particles and non-perovskite-based quantum dots are prepared as wavelength converting particles.

Since the descriptions of the metal halide perovskite nanocrystal particles and the non-perovskite-based quantum dot are the same as those described above, they will be omitted to avoid repeated description.

In this case, the non-perovskite-based quantum dot may be a quantum dot commonly used in the art, may be commercially available, or may be prepared by a method commonly used in the art.

The metal halide perovskite nanocrystal particles may be prepared by the following method, but are not limited thereto.

Figure 3:
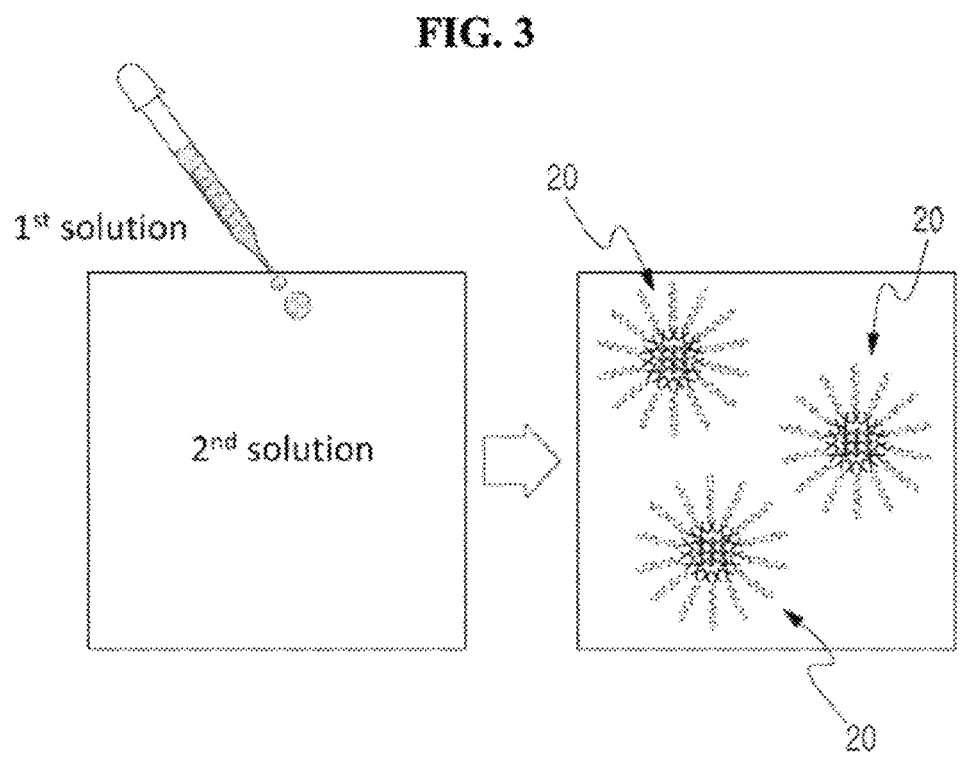

FIG. 3 is a schematic diagram illustrating a method for manufacturing metal halide perovskite nanocrystal particles used as wavelength converting particles in a hybrid wavelength converter according to an embodiment of the present inventive concept.

Referring to FIG. 3, the metal halide perovskite nanocrystal particles may be prepared by an inverse nano-emulsion method, which includes preparing a first solution in which a metal halide perovskite is dissolved in a protic solvent and a second solution in which an alkyl halide surfactant is dissolved in an aprotic solvent, and mixing the first solution with the second solution to form nanocrystal particles, but are not limited thereto.

Hereinafter, to be more specific,

First, a first solution in which a metal halide perovskite is dissolved in a protic solvent and a second solution in which an alkyl halide surfactant is dissolved in an aprotic solvent are prepared.

In this case, the protic solvent may include dimethylformamide, gamma butyrolactone, N-methylpyrrolidone, or dimethylsulfoxide, but is not limited thereto.

In addition, the metal halide perovskite at this time may be a material having a crystal structure. For example, such an organic-inorganic hybrid perovskite may have a structure of $ABX_3$, $A_2BX_4$, $ABX_4$, or $A_{n-1}B_nX_{3n+1}$ (n is an integer between 2 and 6), wherein, A is an organic ammonium material, B is a metal material, and X is a halogen element.

For example, A may be $(CH_3NH_3)_n$, $((C_xH_{2x+1})_nNH_3)_2$ $(CH_3NH_3)n$, $(RNH_3)_2$, $(C_nH_{2n+1}NH_3)_2$, $(CF_3NH_3)$, $(CF_3NH_3)_n$, $((C_xF_{2x+1})_nNH_3)_2(CF_3NH_3)_n$, $((C_xF_{2x+1})_nNH_3)_2$ or $(C_nF_{2n+1}NH_3)_2$ (n is an integer of 1 or more). In addition, B may be a divalent transition metal, a rare earth metal, an alkaline earth metal, Pb, Sn, Ge, Ga, In, Al, Sb, Bi, Po, or a combination thereof. In this case, the divalent rare earth metal may be, for example, Ge, Sn, Pb, Eu, or Yb. In addition, the alkaline earth metal may be, for example, Ca or Sr. In addition, X may be Cl, Br, I, or a combination thereof.

The metal halide perovskite may be prepared by combining AX and $BX_2$ in a predetermined ratio. That is, the first solution may be formed by dissolving AX and $BX_2$ in a protic solvent in a predetermined ratio. For example, by dissolving AX and $BX_2$ in a protic solvent in a 2:1 ratio, a first solution where $A_2BX_3$ metal halide perovskite is dissolved can be prepared.

On the other hand, as a synthesis example of AX at this time, when A is $CH_3NH_3$ and X is Br, $CH_3NH_3Br$ may be obtained through solvent evaporation by dissolving $CH_3NH_2$ (methylamine) and HBr (hydroiodic acid) in a nitrogen atmosphere.

In addition, the aprotic solvent at this time may include dichloroethylene, trichloroethylene, chloroform, chlorobenzene, styrene, dimethylformamide, dimethylsulfoxide, xylene, toluene, cyclohexene, or isopropyl alcohol, but is not limited thereto.

In addition, the alkyl halide surfactant may have an alkyl-X structure. In this case, the halogen element corresponding to X may include Cl, Br, I, or the like. In addition, the alkyl structure at this time may include acyclic alkyl having a structure of $C_nH_{2n+1}$, primary alcohol having a structure such as $C_nH_{2n+1}OH$ or the like, secondary alcohol, tertiary alcohol, alkylamine having an alkyl-N structure (ex. Hexadecyl amine, 9-Octadecenylamine 1-Amino-9-octadecene ($C_{19}H_{37}N$)), p-substituted aniline, phenyl ammonium, or fluorine ammonium, but is not limited thereto.

Next, the first solution is mixed with the second solution to form nanoparticles.

In the stage of mixing the first solution with the second solution to form nanoparticles, it is desirable to drop the first solution one drop each into the second solution and mix it. In addition, stirring of the second solution at this time may be performed. For example, nanocrystal particles may be synthesized by slowly adding first solution drop by drop, in which the organic-inorganic perovskite (OIP) is dissolved, to the second solution in which the alkyl halide surfactant is vigorously stirred is dissolved.

In this case, when the first solution is dropped into the second solution and mixed, organic-inorganic perovskite (OIP) is precipitated in the second solution due to solubility difference. And while the alkyl halide surfactant stabilizes the surface of the organic/inorganic perovskite (OIP) precipitated in the second solution, nano-wavelength converting particles 20 including well dispersed organic/inorganic perovskite nanocrystals (OIP-NC) are produced. At this time, the surface of the metal halide perovskite nanocrystal particles is surrounded by organic ligands that are alkyl halides.

Thereafter, by selectively evaporating protic solvent including nano-wavelength converting particles 20 including metal halide perovskite nanocrystal particles dispersed in an aprotic solvent in which an alkyl halide surfactant is dissolved, or by adding a co-solvent capable of dissolving both a protic solvent and an aprotic solvent, metal halide perovskite nanocrystal particles may be obtained, while a protic solvent including the nanoparticles may be selectively extracted from an aprotic solvent.

Thereafter, by selectively evaporating protic solvent including nano-wavelength converting particles 20 including metal halide perovskite nanocrystal particles dispersed in an aprotic solvent in which an alkyl halide surfactant is dissolved, or by adding a co-solvent capable of dissolving both a protic solvent and an aprotic solvent, metal halide perovskite nanocrystal particles may be obtained, while a protic solvent including the nanoparticles may be selectively extracted from an aprotic solvent.

The metal halide perovskite nanocrystal particles described above can be dispersed in all organic solvents. Accordingly, since the size, the emission wavelength spectrum, the ligand, and the constituent elements may be easily adjusted, it may be applied to various electronic devices.

Meanwhile, the size of the metal halide perovskite nanocrystal particles may be controlled by controlling the length or shape factor of the alkyl halide surfactant. For example, the size of the shape factor can be controlled through linear, tapered, or inverted triangle-shaped surfactants.

Meanwhile, the size of the metal halide perovskite nanocrystal particles formed is preferably 1 nm to 900 nm. If the size of the metal halide perovskite nanocrystal particles is greater than 900 nm, there may be a fundamental problem in that exciton does not emit light and is separated into free charges and dissipated due to thermal ionization and delocalization of charge carriers in large nanocrystals.

Hereinafter, a method of manufacturing a hybrid wavelength converter according to an embodiment of the present inventive concept will be described in detail.

(a) Dispersion Medium Curing Method.

In the method for producing a hybrid wavelength converter according to the present inventive concept, the dispersion medium curing method includes preparing a first dispersion solution by dispersing metal halide perovskite nanocrystal particles and non-perovskite-based quantum dots or non-perovskite phosphors in a dispersion solvent, making a second dispersion solution by dispersing the first dispersion solution in the dispersion medium, and irradiating the second dispersion solution coated on a substrate and step of polymerizing and curing the dispersion medium to form a hybrid wavelength converter.

First, in producing the first dispersion solution, a colloidal solution is formed by dispersing metal halide perovskite nanocrystal particles and a non-perovskite-based quantum dot or a non-perovskite-based phosphor as wavelength converting particles in the dispersion solvent.

In this case, the dispersion solvent may be a material having properties that do not affect the performance of metal halide perovskite nanocrystal particles, non-perovskite-based quantum dots, and non-perovskite-based phosphor as wavelength converting particles. The dispersion solvent may be selected from methanol, ethanol, tert-butanol, xylene, toluene, hexane, octane, cyclohexane, dichloroethylene, chloroform, and chlorobenzene, but is not limited thereto.

In the hybrid wavelength converter, metal halide perovskite nanocrystal particles and non-perovskite-based quantum dots are heterogeneous wavelength converting particles, and thus, there is a large difference in characteristics in absorption and emission with a function of wavelength. In addition, metal halide perovskites have very large absorbance. Therefore, it is difficult to adjust the mixing ratio compared to conventional quantum dot wavelength converter. In this case, it is desirable that the mixing ratio of the metal halide perovskite nanocrystal particles and the non-perovskite-based quantum dot is 1:1 to 2:1 and, when the mixing ratio of the metal halide perovskite nanocrystal particles is large, aggregation of the metal halide perovskite may occur, and thus stable wavelength conversion may not occur, and self-absorption between the metal halide perovskite nanocrystal particles may greatly reduce luminescence efficiency or change emission wavelength.

Next, a dispersion medium is mixed with the first dispersion solution to prepare a second dispersion solution. The dispersion medium may be in a liquid state, and may uniformly disperse the metal halide perovskite nanocrystal particles and the non-perovskite-based quantum dot or the non-perovskite-based phosphor and cured during ultraviolet irradiation to immobilize the metal halide perovskite nanocrystal, non-perovskite-based quantum dot or the non-perovskite-based phosphor. The dispersion medium may be at least one of an epoxy resin, silicon, and a mixture thereof, but is not limited thereto.

Next, the second dispersion solution is coated on the substrate. While coating the second dispersion solution, the dispersion solvent is removed to form a wavelength converter in which metal halide perovskite nanocrystal particles and non-perovskite-based quantum dots or non-perovskite-based phosphors are uniformly mixed in a dispersion medium.

In this case, the coating may be selected from various methods such as spin coating, spray method, dip coating method, bar coating method, nozzle printing method, slot-die coating method, gravure printing method, screen printing method, brush painting method, or roll coating method.

Next, the dispersion medium is polymerized and cured. The polymerization and curing may be performed by irradiating ultraviolet rays, and the ultraviolet rays used may have a wavelength of, for example, 350 to 400 nm, but are not limited thereto.

As the dispersion medium is polymerized and cured, a wavelength conversion is prepared in which metal halide perovskite nanocrystal particles and non-perovskite-based quantum dots or non-perovskite-based phosphors are uniformly mixed in the dispersion medium.

(b) Synthesis Method of In-Situ Perovskite Nanocrystal Particles.

In the method for producing a hybrid wavelength converter according to the present inventive concept, the in-situ perovskite nanocrystal particles synthesis method includes preparing a metal halide perovskite precursor solution by dissolving a metal halide perovskite precursor in a solvent, preparing a third dispersion solution by mixing the non-perovskite-based quantum dots and a dispersion medium with the metal halide perovskite precursor solution, and forming a hybrid wavelength converter by coating the third dispersion solution on a substrate to crystallize and irradiating ultraviolet rays to polymerize and cure the dispersion medium.

First, the stage of preparing a metal halide perovskite precursor solution may be carried out by solvating the metal halide perovskite precursor material in a solvent.

In this case, the solvent may be a material having properties that may dissolve a metal halide perovskite precursor and do not affect the performance of the non-perovskite-based quantum dot. The solvent may be selected from dimethylformamide, dimethylsulfoxide, acetonitrile, gamma butyrolactone, methylpyrrolidone, or isopropyl alcohol, but is not limited thereto.

In the preparing of the third dispersion solution, a colloidal-type solution is formed by dispersing non-perovskite-based quantum dots and a dispersion medium in the metal halide perovskite precursor solution together. The third dispersion solution produced in this way is a colloidal-type solution where a metal halide perovskite precursor material is dissolved and quantum dots and polymers are dispersed.

Thereafter, the third dispersion solution is coated on the substrate. While coating the third dispersion solution, the dispersion solvent is removed to crystallize the metal halide perovskite precursor material on the substrate, thereby forming a wavelength converter in which metal halide perovskite nanocrystal particles, non-perovskite-based quantum dots, and a dispersion medium are uniformly mixed.

In this case, the coating may be selected from various methods such as spin coating, spray method, dip coating method, bar coating method, nozzle printing method, slot-die coating method, gravure printing method, screen printing method, brush painting method, or roll coating method.

Next, the dispersion medium is polymerized and cured. The polymerization and curing may be performed by irradiating ultraviolet rays, and the ultraviolet rays used may have a wavelength of, for example, 350 to 400 nm, but are not limited thereto.

As the dispersion medium is polymerized and cured, a wavelength converter is prepared in which metal halide perovskite nanocrystal particles and non-perovskite-based quantum dots are uniformly mixed and fixed in the dispersion medium.

In this case, the step of coating the third dispersion solution on the substrate and the step of irradiating ultraviolet rays may be performed in a reverse order or may be performed simultaneously.

Thereafter, a step of additionally removing the substrate may be further included if necessary.

(c) Dispersion Medium Sealing Method.

In the method for manufacturing a hybrid wavelength converter according to the present inventive concept, the dispersion medium sealing method includes stacking the first sealing element and the second sealing element, adhering one side of the first sealing element and the second sealing element, injecting a dispersion medium in which metal halide perovskite nanocrystal particles and non-perovskite-based quantum dots are dispersed as wavelength converting particles between the first sealing element and the second sealing element through the other side to which the first sealing element and the second sealing element are not adhered, and sealing a dispersion medium in which metal halide perovskite nanocrystal particles and non-perovskite-based quantum dots are dispersed as wavelength converting particles by adhering the other side of the first sealing element and the second sealing element.

Figure 4:
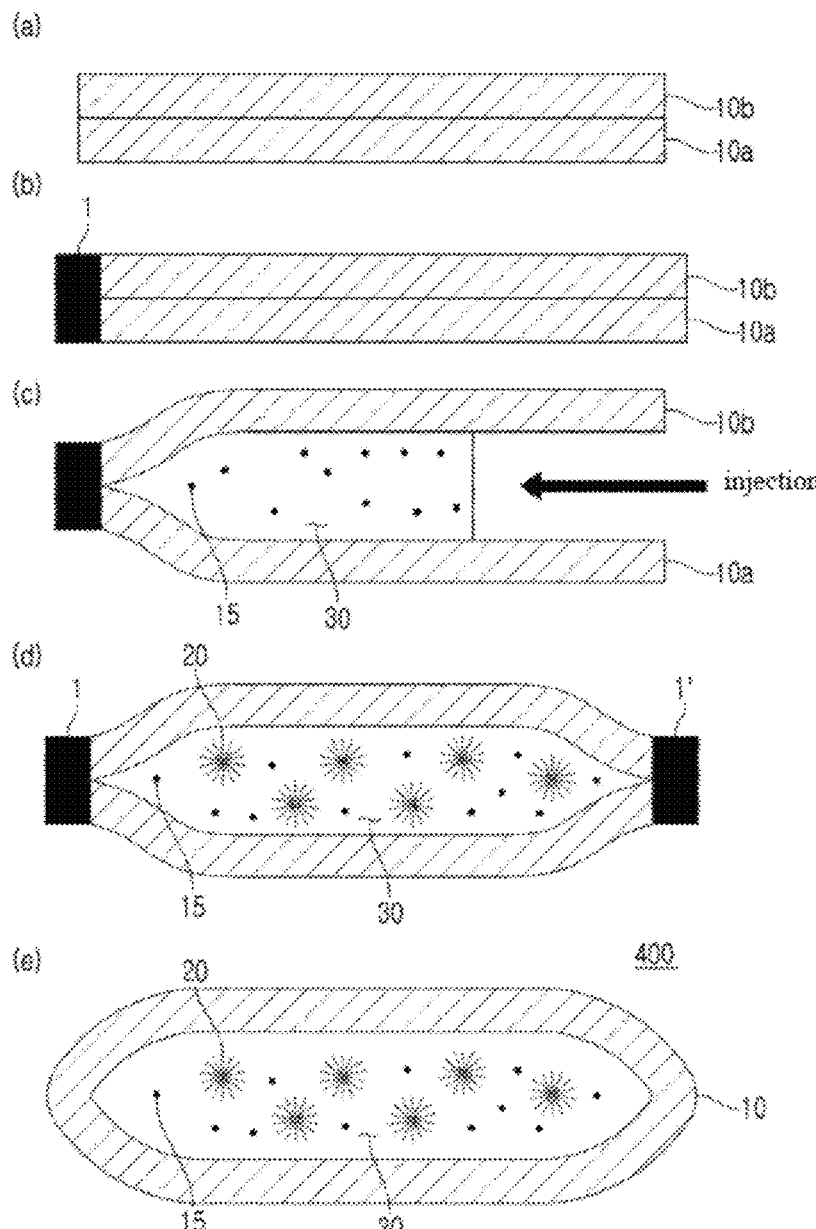
FIG. 4 is a schematic diagram illustrating a method of manufacturing a hybrid wavelength converter according to an embodiment of the present inventive concept.

FIG. 4 is a cross-sectional view illustrating a method of manufacturing a hybrid wavelength converter using a sealing method according to an embodiment of the present inventive concept.

Hereinafter, a method of manufacturing a hybrid wavelength converter using the sealing method will be described in detail with reference to FIG. 4.

Referring to FIG. 4(*a*), a first sealing element 10*a* and a second sealing element 10*b* are stacked.

The sealing element may use a polymer resin or silicon that is not corroded by a dispersion medium 30 in which metal halide perovskite nanocrystal particles 20 and non-perovskite-based quantum dots 15 are dispersed as wavelength converting particles. In particular, since the polymer resin can be heated and adhered, by using a thermal adhesion process, the polymer resin in a form of sheet may be used to form a wavelength converter in the form of a pack into which a dispersion medium 30 in which wavelength converting particles 15, 20 are dispersed is injected.

Referring to FIG. 4(*b*), the first sealing element 10*a* and the second sealing element 10*b* may be heated and adhered using a thermal adhesion process so that the wavelength converting particles 15, 20 and the dispersion medium 30 do not leak from the sealing elements 10*a*, 10*b*. However, if the wavelength converting particles 15, 20 and the dispersion medium 30 described above do not leak out, other adhesion processes other than the thermal adhesion process may be used.

Referring to FIG. 4(*c*), a dispersion medium 30 where the wavelength converting particles 15, 20 are dispersed is injected between the first sealing element 10*a* and the second sealing element 10*b* at the other side to which the above-described first sealing element 10*a* and second sealing element 10*b* are not adhered.

Referring to FIG. 4(*d*), the other side 1 of the first sealing element 10*a* and the second sealing element 10*b* described above is adhered using a thermal adhesion process to seal the dispersion medium 30 in which the wavelength converting particles 15, 20 are dispersed with sealing elements 10*a*, 10*b*.

Referring to FIG. 4(*e*), it shows that a hybrid wavelength converter 400 in which a dispersion medium 30 where the wavelength converting particles 15, 20 are dispersed is sealed with a sealing element 10 is formed.

The hybrid wavelength converter 400 manufactured by the above method has the advantage of being applied to a light-emitting device without the need for an additional ligand purification process by dispersing and sealing the metal halide perovskite nanocrystal particles 20 and non-perovskite-based quantum dots 15 in a dispersion medium 30. Accordingly, oxidation of wavelength converting particles generated during ligand purification may be prevented, and thus, high color purity and luminescence efficiency may be exhibited when applied to a light-emitting device. In addition, the process may be simplified.

In addition, the hybrid wavelength converter 400 may significantly reduce cadmium content by replacing a part of the conventional quantum dot wavelength converter with metal halide perovskite nanoparticles that do not contain cadmium. In particular, since metal halide perovskite nanoparticles have a greater absorbance than quantum dots, only a smaller amount of light emitter can be used to ensure equal or higher efficiency characteristics than conventional quantum dots.

<Light-Emitting Device>

Figures 5, 6:
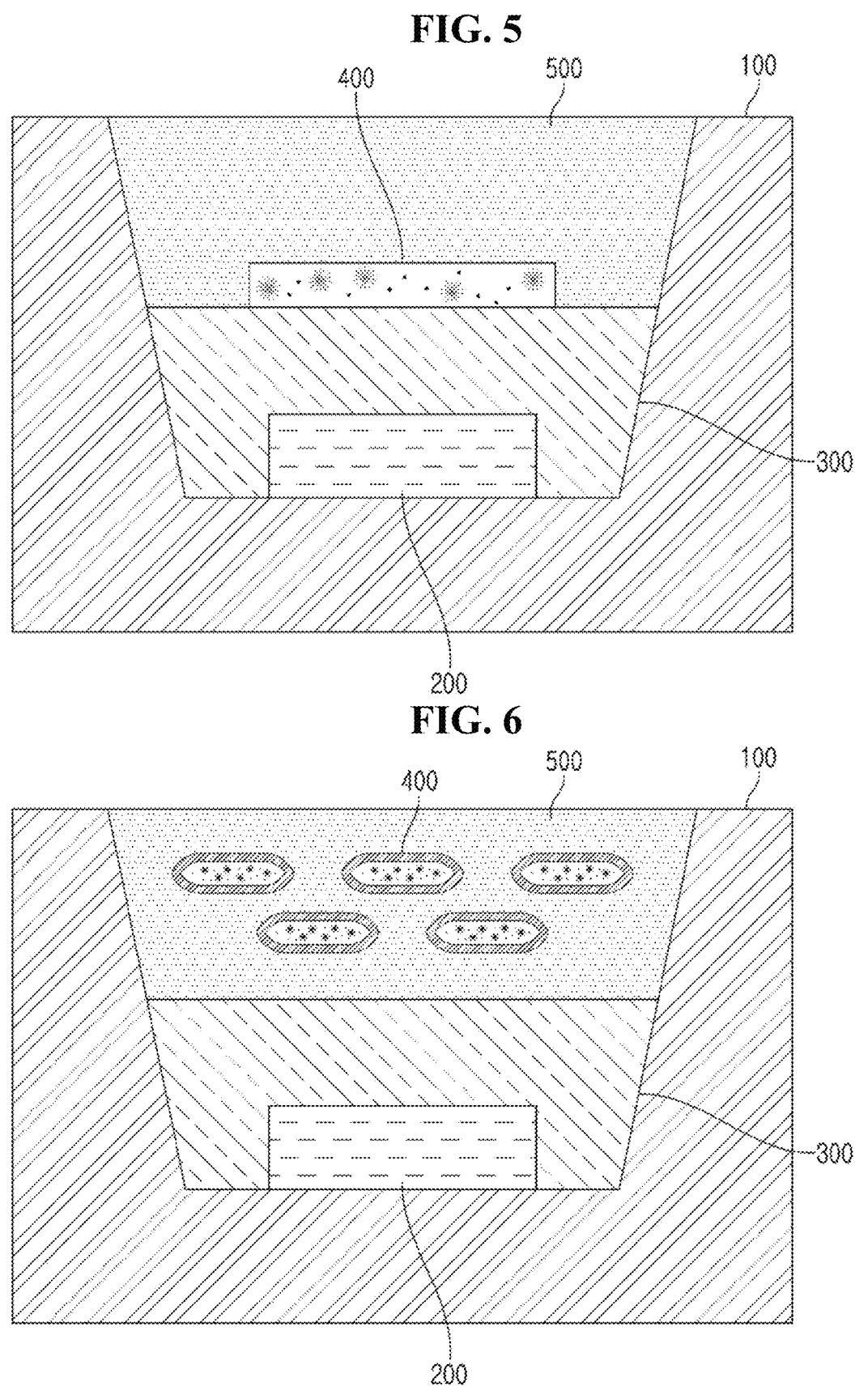

In addition, the present inventive concept provides a light-emitting device including the hybrid wavelength converter. FIGS. 5 and 6 are cross-sectional views of a light-emitting device according to an embodiment of the present inventive concept.

Referring to FIGS. 5 and 6, the light-emitting device according to an embodiment of the present inventive concept includes a base structure 100, at least one excitation light source 200 disposed on the base structure 100 and emitting light at a predetermined wavelength, and the hybrid wavelength converter 400 disposed in the optical path of the excitation light source 200.

The base structure 100 described above may be a package frame or a base substrate. When the base structure 100 is a package frame, the package frame may include the base substrate. The base substrate may be a submount substrate or a light-emitting diode wafer. The light-emitting diode wafer is a form before being separated into units of light-emitting diode chips, and represents a form in which a light-emitting diode device is formed on the wafer. The base substrate may be a silicon substrate, a metal substrate, a ceramic substrate, or a resin substrate.

The base structure 100 described above may be a package lead frame or a package pre-mold frame. The base structure 100 may include a bonding pad (not shown). The bonding pads may contain Au, Ag, Cr, Ni, Cu, Zn, Ti, Pd, or the like. External connection terminals (not shown) respectively connected to bonding pads may be disposed on the outer side of the base structure 100. The bonding pads and the external connection terminals may be those provided in the package lead frame.

The excitation light source 200 is disposed on the above-described base structure 100. It is preferable that the excitation light source 200 emits light having a wavelength shorter than that of the wavelength converting particles (metal halide perovskite nanocrystal particles, non-perovskite quantum dots, or non-perovskite phosphor) of the hybrid wavelength converter 400 according to the present inventive concept. The above-described excitation light source 200 can be a light-emitting diode or a laser diode. In addition, when the base structure 100 is a light-emitting diode wafer, the step of disposing the excitation light source can be omitted. For example, a blue LED can be used as the excitation light source 200, and a gallium nitride LED emitting blue light of 420 nm to 480 nm can be used as the blue LED.

As shown in FIG. 5 and FIG. 6, an encapsulation material for encapsulating the excitation light source 200 described above can be filled to form a first encapsulation part 300. The above-described first encapsulation part 300 can serve not only to encapsulate the above-described excitation light source 200 but also to serve as a protective layer. In addition, when the above-described wavelength converter 400 is located on the first encapsulation part 300, a second encapsulation part 500 can be further formed to protect and fix the same. The encapsulation material can include at least one of epoxy, silicone, acrylic polymer, glass, carbonate polymer, and a mixture thereof.

The first encapsulation part 300 can form in different methods including a compression molding method, a transfer molding method, a dotting method, a blade coating method, a screen coating method, a dip coating method, a spin coating method, a spray method or inkjet printing method. However, the first encapsulation part 300 can be omitted. Since the detailed description of the hybrid wavelength converter 400 is the same as that described above, it will be omitted to avoid repeated descriptions.

As shown in FIG. 5 and FIG. 6, the second encapsulation part 500 can be formed by filling the above-described wavelength converter 400 with an encapsulation material for encapsulating the above-described wavelength converter 400. The second encapsulation part 500 can use the same material as the first encapsulation part 300 described above, and can be formed through the same manufacturing method.

In addition, the light-emitting device according to the present inventive concept can further include a groove part including a bottom surface on which the excitation light source is to be mounted and a side surface on which a reflective part is formed, and a support part supporting the groove part described above and having an electrode part electrically connected to the excitation light source descried above.

The above-described light-emitting device can be applied not only to a light-emitting device but also to lighting, a backlight unit.

In an embodiment of the present inventive concept, although the light-emitting device is illustrated by a limited unit cell, when the base structure is a sub-mount substrate or a light-emitting diode wafer, the light-emitting device can be processed into each unit cell by cutting the sub-mount substrate or the light-emitting diode wafer described above after disposing of a plurality of light-emitting diode chips having a wavelength converter.

[Modes for Carrying Out the Inventive Concept]

Hereinafter, preferred production examples and experimental examples are presented to aid in the understanding of the present inventive concept. However, the following production examples and experimental examples are only intended to help the understanding of the present inventive concept. The present inventive concept is not limited by the following production examples and experimental examples.

Production Example 1

Manufacture of Green-Emitting Metal Halide Perovskite Nanocrystal Particle

A first solution is prepared by dissolving metal halide perovskite in a polar solvent. Dimethylformamide is used as a polar solvent at this time, and $CH_3NH_3PbBr_3$ is used as a metal halide perovskite. The $CH_3NH_3PbBr_3$ used at this time is mixed with $CH_3NH_3Br$ and $PbBr_2$ at a ratio of 1:1 by adding 0.4 mmol, respectively.

And a second solution in which an amine ligand and a carboxylic acid surfactant are dissolved in a non-polar solvent is prepared. In this case, hexane is used as the non-polar solvent, octylamine is used as the amine ligand surfactant, and oleic acid is used as the carboxylic acid surfactant.

Then, the first solution is slowly added drop by drop to the second solution that is being vigorously stirred to form metal halide perovskite nanocrystal particles.

Thereafter, the nanocrystal particles and the solvent are separated using centrifugation, a supernatant (solvent) is poured out, and then new toluene is added to redisperse the nanocrystal particles.

In the subsequent procedure, a redispersed perovskite nanocrystal particle solution is used.

Production Example 2

Manufacture of Red Light-Emitting Metal Halide Perovskite Nanocrystal Particle

A first solution is prepared by dissolving metal halide perovskite in a polar solvent. At this time, 1-butanol is used as a polar solvent, and $CH_3NH_3PbI_3$ is used as a metal halide perovskite. At this time, the $CH_3NH_3PbI_3$ used is mixed with $CH_3NH_3I$ and $PbI_2$ at a 1:1 ratio by adding 0.8 mmol, respectively.

And a second solution in which an amine ligand and a carboxylic acid surfactant are dissolved in a non-polar solvent is prepared. In this case, 1-octadecene is used as the non-polar solvent, oleylamine is used as the amine ligand surfactant, and oleic acid surfactant is used as the carboxylic acid surfactant.

Then, the first solution is slowly added drop by drop to the second solution that is being vigorously stirred to form metal halide perovskite nanocrystal particles.

Thereafter, the nanocrystal particles and the solvent are separated using centrifugation, a supernatant (solvent) is poured out, and then new toluene is added to redisperse the nanocrystal particles.

In the subsequent procedure, a redispersed perovskite nanocrystal particles solution is used.

Production Example 3

Manufacture of Green-Emitting CdSe Core-ZnS Shell Quantum Dot 2 mmol of CdO and 8 mmol of octodecylphosphonic acid (ODPA) are added to 80 g of 1-octadecene (ODE) and dissolved at 300° C. under a nitrogen atmosphere to prepare the first solution. After the first solution is cooled to room temperature, 36 g of octadecylamine (ODA) and 12 g of trioctylphosphine oxide (TOPO) are added thereto and heated to 280° C., 25 mmol of selenium dissolved in 8 g of tributylphosphine (TBP) is injected to synthesize CdSe quantum dots. For a subsequent process, the synthesized quantum dots are cooled to room temperature and their impurities are removed.

Next, 5 mmol of ZnO is dissolved in 40 mmol of oleic acid and ODE 37 mL to prepare a second solution. And a third solution is prepared by dissolving an amount of S reaching 0.1 mmol/mL in ODE.

Thereafter, the synthesized CdSe quantum dots are mixed with 200 g of ODE and 60 g of ODA to raise the temperature to 240° C., and then the second solution (7.8 mL) and the third solution (7.8 mL) are sequentially added at 10 minute intervals to synthesize the quantum dots of the CdSe core-ZnS shell. The synthesized quantum dots are precipitated using acetone and redispersed in toluene.

Production Example 4

Manufacture of Red-Emitting CdSe Core-ZnS Shell Quantum Dot 2 mmol of CdO and 8 mmol of octodecylphosphonic acid (ODPA) are added to 80 g of 1-octadecene (ODE) and dissolved at 300° C. under a nitrogen atmosphere to prepare the first solution.

After the first solution is cooled to room temperature, 15 g of octadecylamine (ODA) and 5 g of trioctylphosphine oxide (TOP) are added thereto and heated to 280° C., 25 mmol of selenium dissolved in 8 g of tributylphosphine (TBP) is added to synthesize CdSe quantum dots. For a subsequent process, the synthesized quantum dots are cooled to room temperature and their impurities are removed.

Next, 5 mmol of ZnO is dissolved in 40 mmol of oleic acid and ODE 37 mL to prepare a second solution. And a third solution is prepared by dissolving an amount of S reaching 0.1 mmol/mL in ODE.

Thereafter, the synthesized CdSe quantum dots are mixed with ODE 100 g and ODA 30 g to raise the temperature to 240° C., and then the second solution (9 mL)-third solution (9 mL)-second solution (9 mL)-third solution (9 mL)-second solution (9 mL) is sequentially added at 10 minute intervals to synthesize the CdSe core-ZnS shell quantum dots. The synthesized quantum dots are precipitated using acetone and redispersed in toluene.

Production Example 5

Manufacture of Hybrid Wavelength Converter
(Dispersion Medium Curing Method)

A first dispersion solution is prepared by dispersing the green-emitting metal halide perovskite nanocrystal particles prepared in Production Example 1 and the red-emitting CdSe core-ZnS shell quantum dots prepared in Production Example 4 in toluene as a dispersion solvent.

Thereafter, a SU-8 epoxy photoresist is added to the first dispersion solution as a dispersion medium and mixed to prepare a second dispersion solution.

Thereafter, the second dispersion solution is coated on a bare glass substrate by a dip coating method. After coating, the dispersion solvent is removed by evaporating, making a layer in which metal halide perovskite nanocrystal particles and non-perovskite-based quantum dots are uniformly mixed on the bare glass substrate mentioned before.

Next, ultraviolet rays of a wavelength of 365 nm are irradiated to the coated substrate, and the SU-8 epoxy photoresist, which is a dispersion medium, is polymerized and cured by the irradiated ultraviolet rays. Consequently, quantum dots and metal halide perovskite nanocrystal particles are uniformly mixed and fixed on the substrate to prepare a hybrid wavelength converter.

Figure 7:
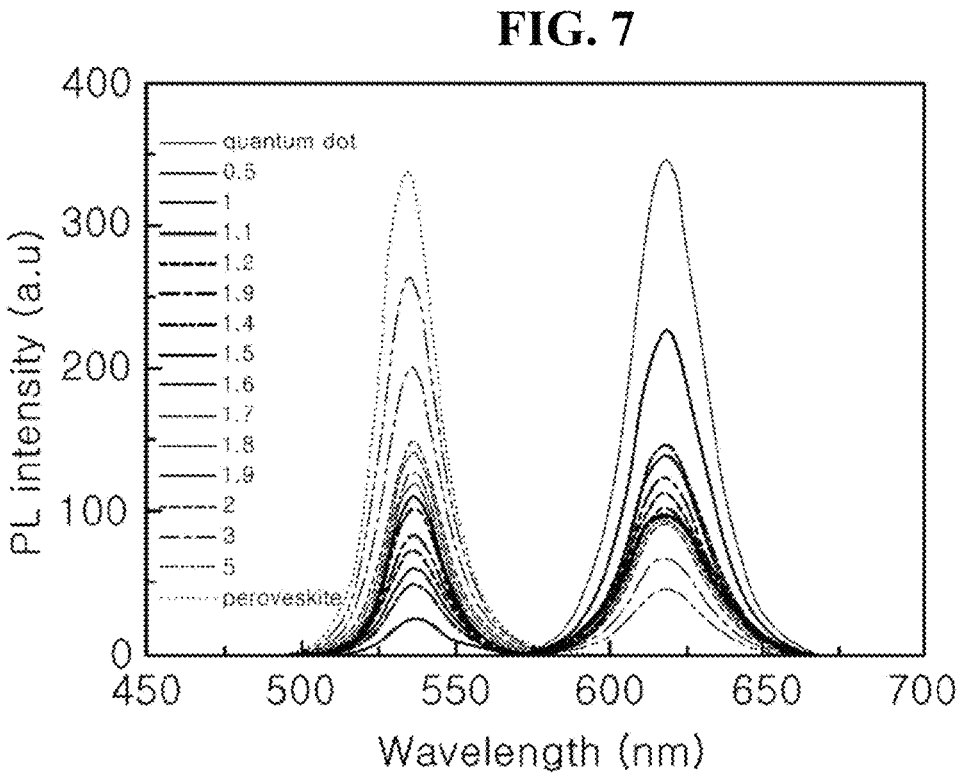
FIG. 7 is a graph showing results of photoluminescence of a hybrid wavelength converter according to a Production Example of the present inventive concept.

The photoluminescence results of the prepared hybrid wavelength converter measured by using the photoluminescence spectrometer are shown in FIG. 7.

As illustrated in FIG. 7, when the excitation light of 405 nm is irradiated to the hybrid wavelength converter according to the present inventive concept, it is confirmed that wavelengths are converted into green light of 520 nm and red light of 620 nm. In this case, it is confirmed that the intensity ratio of green light and red light is changed according to the mixing ratio of the metal halide perovskite nanocrystal particles and the quantum dot, and the intensity of green light and red light became similar at about 1:1 mixing ratio.

Production Example 6

Manufacture of Hybrid Wavelength Converter
(In-Situ Perovskite Nanocrystal Particle Synthesis
Method)

A precursor of green light-emitting metal halide perovskite $CH_3NH_3PbBr_3$ is dissolved in dimethylformamide as a solvent to prepare a metal halide perovskite precursor solution. The CdSe core-ZnS shell quantum dot prepared in Production Example 4 and SU-8 epoxy photoresist as a dispersion medium are added to the metal halide perovskite precursor solution, and uniformly mixed to prepare a third dispersion solution.

Thereafter, the third dispersion solution is coated on a bare glass substrate by a dip coating method, and ultraviolet rays are irradiated on the substrate. The light of 365 nm is used for the ultraviolet rays. Accordingly, the dispersion solvent is removed to crystallize the metal halide perovskite precursor material to form metal halide perovskite nanocrystal particles, and SU-8 photoresist is cured. Consequently, metal halide perovskite nanocrystal particles and quantum dots are dispersed and fixed uniformly in the dispersion medium to prepare a hybrid wavelength converter.

Production Example 7

Manufacture of Hybrid Wavelength Converter
(Sealing Method for Dispersion Medium)

Referring to FIG. 4, a hybrid wavelength converter is prepared using a sealing method for dispersion medium as follows.

In this case, PMMA is used as the sealing element, and the first sealing element (the first PMMA) and the second sealing element (the second PMMA) are stacked.

Thereafter, one side of the first sealing element and the second sealing element is heated and adhered.

Next, the green-emitting metal halide perovskite nanocrystal particles manufactured in Production Example 1 and the red-emitting CdSe core-ZnS shell quantum dots manufactured in Production Example 4 are injected between the first sealing element and the second sealing element at the other side where the two sealing elements do not adhere to each other. Then, by heating and bonding the other side of the first sealing element and the second sealing element, the dispersion medium in which the metal halide perovskite nanocrystal particles and quantum dots are dispersed is sealed with a sealing element. In this case, an SU-8 epoxy photoresist is used as the dispersion medium.

Production Example 8

Manufacture of Hybrid Wavelength Converter
(Curing Method for Dispersion Medium)

A first dispersion solution is prepared by dispersing the red-emitting metal halide perovskite nanocrystal particles and the green-emitting carbon nitride-based phosphor prepared in Production Example 2 in toluene as a dispersion solvent.

Thereafter, a SU-8 epoxy photoresist is added to the first dispersion solution as a dispersion medium and mixed to prepare a second dispersion solution.

Thereafter, the second dispersion solution is coated on a bare glass substrate by a dip coating method, and after coating, the dispersion solvent is evaporated and removed to prepare a layer in which metal halide perovskite nanocrystal particles and non-perovskite-based phosphors are uniformly mixed on the glass substrate.

Next, ultraviolet rays of a wavelength of 365 nm are irradiated to the coated substrate, and the SU-8 epoxy photoresist, which is a dispersion medium, is polymerized and cured by the irradiated ultraviolet rays. Consequently, metal halide perovskite nanocrystal particles and non-perovskite-based phosphors are uniformly mixed and fixed in the dispersion medium to prepare a hybrid wavelength converter.

Figure 10:
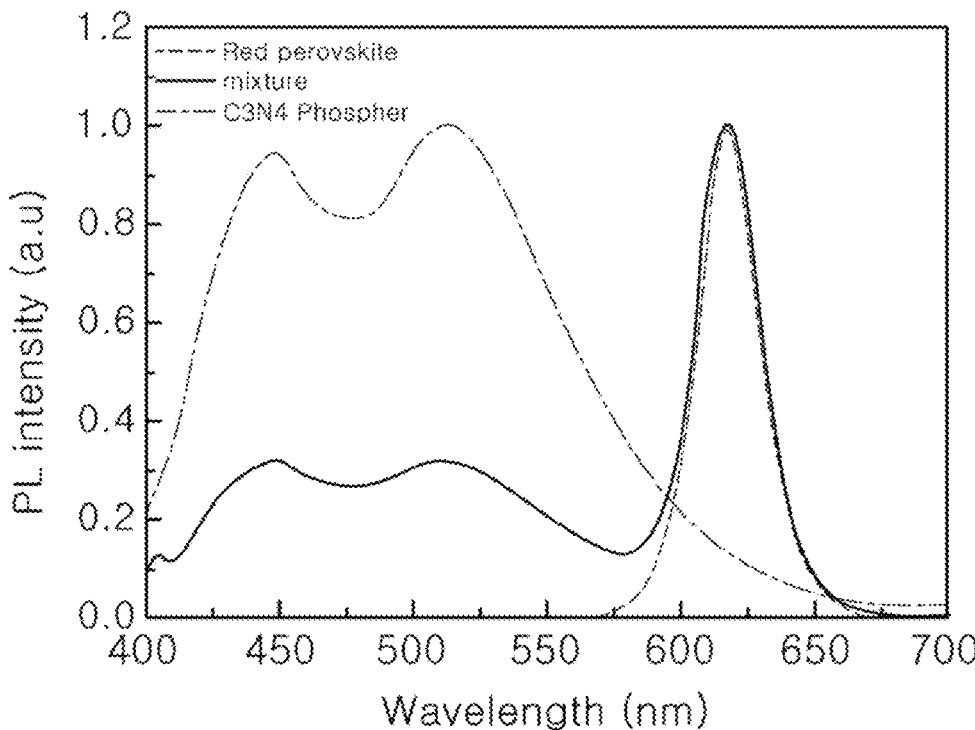
FIG. 10 is a graph showing results of photoluminescence of a hybrid wavelength converter according to another Production Example of the present inventive concept.

The results of the photoluminescence of the prepared hybrid wavelength converter measured by using the photoluminescence spectrometer are shown in FIG. 10.

As shown in FIG. 10, when irradiating excitation light of 405 nm to the hybrid wavelength converter according to the present inventive concept, it is confirmed that wavelength is converted into light-emitting wavelengths of a single wavelength converter, green light of ~500 nm and red light of 620 nm.

In addition, when comparing the amount of green light emitters used to similarly control the intensity of green light and red light, the ratio of green light emitters can be reduced to ¼ in hybrid wavelength converter. This is due to the large absorbance and excellent luminescence properties of the metal halide perovskite nanocrystal particles.

FIG. 1 is a schematic diagram illustrating a hybrid wavelength converter according to an embodiment of the present inventive concept.

FIG. 2 is a schematic diagram illustrating a hybrid wavelength converter according to another embodiment of the present inventive concept.

FIG. 3 is a schematic diagram illustrating a method for manufacturing metal halide perovskite nanocrystal particles used in a hybrid wavelength converter according to an embodiment of the present inventive concept.

FIG. 4 is a schematic diagram illustrating a method of manufacturing a hybrid wavelength converter according to an embodiment of the present inventive concept.

FIG. 5 is a cross-sectional view of a light-emitting device including a hybrid wavelength converter according to an embodiment of the present inventive concept.

FIG. 6 is a cross-sectional view of a light-emitting device including a hybrid wavelength converter according to another embodiment of the present inventive concept.

FIG. 7 is a graph showing results of photoluminescence of a hybrid wavelength converter according to a Production Example of the present inventive concept.

Figure 8:
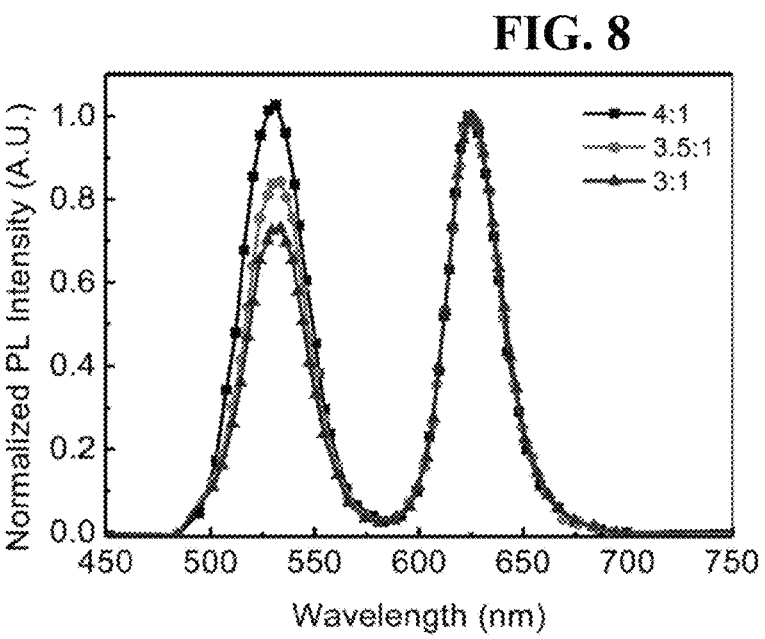
FIG. 8 is a graph showing results of photoluminescence of a wavelength converter according to a Comparative Example of the present inventive concept.

FIG. 8 is a graph showing results of photoluminescence of a wavelength converter according to a Comparative Example of the present inventive concept.

Figure 9:
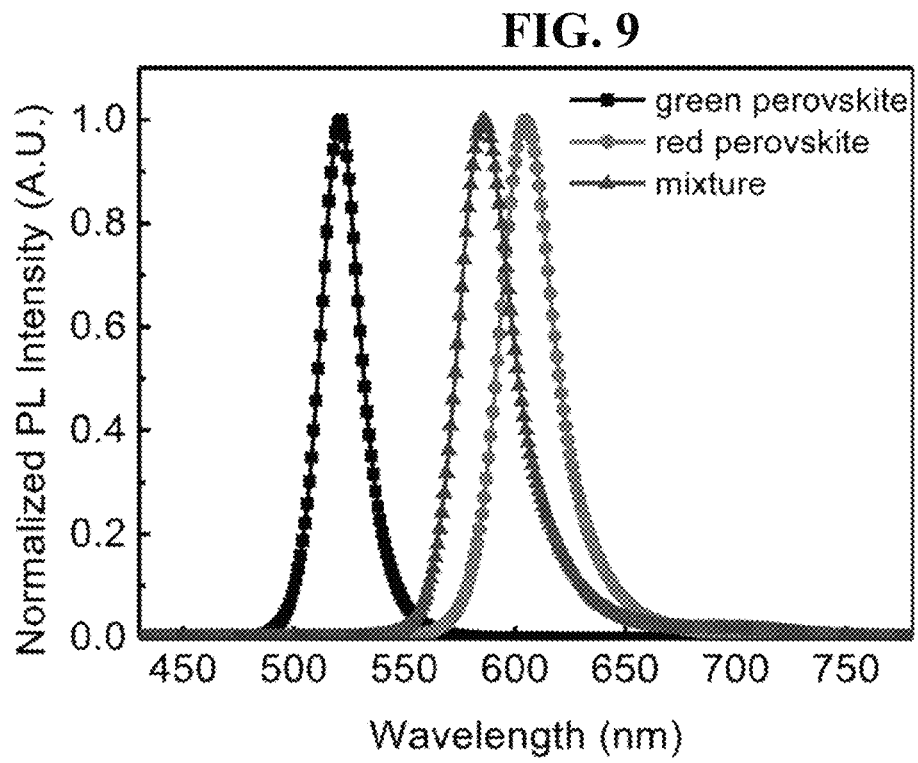
FIG. 9 is a graph showing results of photoluminescence of a wavelength converter according to another Comparative Example of the present inventive concept.

FIG. 9 is a graph showing results of photoluminescence of a wavelength converter according to another Comparative Example of the present inventive concept.

FIG. 10 is a graph showing results of photoluminescence of a hybrid wavelength converter according to another Production Example of the present inventive concept.

Comparative Example 1

Manufacture of Quantum Dot Wavelength Converter

The green-emitting CdSe core-ZnS shell quantum dots prepared in Preparation Example 3 and the red-emitting CdSe core-ZnS shell quantum dots prepared in Preparation Example 4 were dispersed and mixed in toluene, and then uniformly mixed with SU-8 epoxy photoresist as a dispersion medium to prepare a mixed dispersion solution.

Thereafter, the mixed dispersion solution was coated on a glass substrate by a dip coating method to prepare a layer in which green-emitting quantum dots, red-emitting quantum dots, and SU-8 photoresist were uniformly mixed on the substrate.

Next, UV light of 365 nm wavelength were irradiated on the coated substrate, and the SU-8 epoxy photoresist, which is a dispersion medium, was polymerized and cured by the irradiated UV light, to produce a quantum dot wavelength converter in which green and red quantum dots were uniformly mixed in the dispersion medium.

FIG. 8 shows the results of the photoluminescence of the prepared quantum dot wavelength converter measured by using a photoluminescence spectrometer.

As shown in FIG. 8, when irradiating the quantum dot wavelength converter with excitation light of 405 nm, it was confirmed that wavelengths were converted to 520 nm green light and 620 nm red light. Herein, the weight ratio of the green-emitting quantum dot to the red-emitting quantum dot used to obtain the similar intensity of the green light and the red light in the quantum dot wavelength converter was 4:1.

That is, when comparing FIG. 7 with FIG. 8, in the hybrid wavelength converter according to the present inventive concept, the Cd content in the wavelength converter can be greatly reduced to 20% while replacing the green-emitting quantum dot, which occupied 80% of Cd content in the quantum dot wavelength converter, with metal halide perovskite nanocrystal particles. In addition, when comparing the amount of green emitters used to adjust the intensity of green light and red light similarly, the proportion of green emitters in a hybrid wavelength converter can be reduced to 25%. This is due to the large absorbance of the metal halide perovskite nanocrystal particles with photoluminescence properties.

Comparative Example 2

Preparation of Metal Halide Perovskite Nanocrystal Particles Wavelength Converter The green-emitting metal halide perovskite nanocrystal particles prepared in Preparation Example 1 and the red-emitting metal halide perovskite nanocrystal particles prepared in Preparation Example 2 are dispersed and mixed with toluene, and then uniformly mixed with SU-8 epoxy photoresist as a dispersion medium to prepare a mixed dispersion solution.

Thereafter, the mixed dispersion solution is dip-coated on a (bare) glass substrate to remove the dispersion solvent, and a layer in which green-emitting metal halide perovskite nanocrystal particles, red-emitting metal halide perovskite nanocrystal particles, and SU-8 photoresist are uniformly mixed on the substrate is produced.

Next, ultraviolet rays having a wavelength of 365 nm are irradiated to the coated substrate, and the SU-8 epoxy photoresist, which is a dispersion medium, is polymerized and cured by the irradiated ultraviolet rays, and thus a wavelength converter in which green metal halide perovskite nanocrystal particles and red metal halide perovskite nanocrystal particles are uniformly mixed is produced on the substrate. FIG. 9 illustrates the results of measuring the photoluminescence of the prepared metal halide perovskite nanocrystal particles wavelength converter using a photoluminescence measuring apparatus.

As shown in FIG. 9, when irradiating excitation light of 405 nm, it is found that the light is converted to green light of 520 nm out of green-emitting metal halide perovskite nanocrystal particles and to red light of 620 nm out of the red light-emitting metal halide perovskite nanocrystal particles. However, in the case of a wavelength converter in which green-emitting metal halide perovskite nanocrystal particles and red light-emitting metal halide perovskite nanocrystal particles were mixed, the green and red light-emitting metal halide perovskite nanocrystal particles did not maintain their respective emission wavelengths and exhibited a single color of light emission of 580 nm.

This shows the limitation of metal halide perovskite nanocrystal particles in which wavelengths cannot be converted to two or more wavelengths simultaneously by a single excitation light in the case of metal halide perovskite nanocrystal particles wavelength converter.

Unlike this, the hybrid wavelength converter according to the present inventive concept can simultaneously convert wavelengths into red and green light by a single excitation light, and can be optically stable and improved color purity and luminescence performance without changing the emission wavelength range even with a lower cadmium content than the quantum dot wavelength converter.

Although the present inventive concept has been described above with reference to preferred embodiments, it should be understood that the present inventive concept is not limited to the above embodiments. The present inventive concept may variously transform and modify the above embodiments within the scope of claims to be described below, all of which fall within the scope of the present inventive concept. Accordingly, the present inventive concept is limited only by the claims and their equivalents.

EXPLANATION OF THE DESCRIPTION

10, 10a, 10b: Sealing element
15: Non-perovskite-based quantum dot
20: Metal halide perovskite nanocrystal particle
30: Dispersion medium
100: Base structure
200: Excitation light source
300: The first sealing part
400: Wavelength converter
500: The second sealing part

The invention claimed is:

1. A hybrid wavelength converter comprising:
metal halide perovskite nanocrystal particles as a first wavelength converting particle that converts the wavelength of light generated from an excitation light source into a specific wavelength;
non-perovskite-based quantum dots as a second wavelength converting particle that converts a wavelength of light generated from the excitation light source into a specific wavelength; and
a dispersion medium for dispersing the metal halide perovskite nanocrystal particles and the non-perovskite-based quantum dots,
wherein a mixing ratio of the metal halide perovskite nanocrystal particles and the non-perovskite-based quantum dots is 1:1 to 2:1 by weight.

2. The hybrid wavelength converter of claim 1,
wherein the hybrid wavelength converter further comprises a sealing element for sealing a dispersion medium in which the metal halide perovskite nanocrystal particles and the non-perovskite-based quantum dots are dispersed.

3. The hybrid wavelength converter of claim 1,
wherein the metal halide perovskite nanocrystal particles and the non-perovskite-based quantum dots convert the wavelength of light generated from an excitation light source into different wavelengths.

4. The hybrid wavelength converter of claim 3,
wherein the metal halide perovskite nanocrystal particles emits green light and the non-perovskite-based quantum dots emits red light upon being irradiated by a blue light generated from an excitation light source.

5. The hybrid wavelength converter of claim 1,
wherein the metal halide perovskite nanocrystal particles further include a plurality of organic ligands surrounding nanocrystals in the metal halide perovskite nanocrystal particles and can be dispersed in an organic solvent.

6. The hybrid wavelength converter of claim 1,
wherein the metal halide perovskite nanocrystal particles include a structure of $A_2BX_4$, $ABX_4$, $ABX_3$, or $A_{n-1}B_nX_{3n+1}$, wherein n is an integer between 2 and 6, A is organic ammonium, B is a metal material, and X is a halogen element.

7. The hybrid wavelength converter of claim 1,
wherein the size of the metal halide perovskite nanocrystal particles is 1 nm to 900 nm and the bandgap energy is 1 eV to 5 eV.

8. The hybrid wavelength converter of claim 1,
wherein the non-perovskite-based quantum dots comprise at least one selected from the group consisting of a-Si-based nanocrystals, a group II-IV-based compound semiconductor nanocrystal, a group III-V compound semiconductor nanocrystal, a group IV-VI compound semiconductor nanocrystal, a boron quantum dot, a carbon quantum dot, a metal quantum dot, and a mixture thereof.

9. The hybrid wavelength converter of claim 1,
wherein the dispersion medium is at least one selected from the group consisting of an epoxy resin, silicon, and a mixture thereof.

10. The hybrid wavelength converter of claim 2,
wherein the sealing element is at least one selected from the group consisting of epoxy resin, acrylic polymer, glass, carbonate polymer, silicon, and a mixture thereof.

11. A method for manufacturing a hybrid wavelength converter comprising:
manufacturing a first dispersion solution by mixing metal halide perovskite nanocrystal particles with non-perovskite-based quantum dots as wavelength converting particles in a dispersion solvent;
manufacturing a second dispersion solution by mixing a dispersion medium with the first dispersion solution; and
coating the second dispersion solution on a substrate and irradiating ultraviolet rays to polymerize and cure the dispersion medium to form a hybrid wavelength converter,
wherein a mixing ratio of the metal halide perovskite nanocrystal particles and the non-perovskite-based quantum dots is 1:1 to 2:1 by weight.

12. A method for manufacturing a hybrid wavelength converter comprising:
manufacturing a metal halide perovskite precursor solution by dissolving a metal halide perovskite precursor in a solvent;
manufacturing a third dispersion solution by mixing non-perovskite-based quantum dots and a dispersion medium with the metal halide perovskite precursor solution; and
forming a hybrid wavelength converter by coating the third dispersion solution on a substrate to crystallize and irradiating ultraviolet rays to polymerize and cure the dispersion medium,
wherein a ratio of metal halide perovskite nanocrystal particles and the non-perovskite-based quantum dots is 1:1 to 2:1 by weight.

13. A method for manufacturing a hybrid wavelength converter comprising:
laminating a first sealing element and a second sealing element;

bonding one side of the first sealing element and the second sealing element;

injecting a dispersion medium, in which metal halide perovskite nanocrystal particles and non-perovskite-based quantum dots are dispersed as wavelength converting particles, between the first sealing element and the second sealing element through the other side where the first and second sealing elements not bonded; and sealing the dispersion medium in which the metal halide perovskite nanocrystal particles and the non-perovskite-based quantum dots are dispersed as wavelength converting particles by bonding the other side of the first sealing element and the second sealing element, wherein a mixing ratio of the metal halide perovskite nanocrystal particles and the non-perovskite-based quantum dots is 1:1 to 2:1 by weight.

14. A light-emitting device comprising:

a base structure;

at least one excitation light source emitting light of a predetermined wavelength disposed on the base structure; and a hybrid wavelength converter disposed in the optical path of the excitation light source and converting the wavelength of light generated from the excitation light source to a specific wavelength, wherein the hybrid wavelength converter comprises metal halide perovskite nanocrystal particles as the first wavelength converting particle converting the wavelength of light generated from the excited light source into a specific wavelength, non-perovskite-based quantum dots as the second wavelength converter converting the wavelength of light generated from the excited light source into a specific wavelength, and a dispersion medium which disperses the metal halide perovskite nanocrystal particles and the non-perovskite-based quantum dots, wherein the metal halide perovskite nanocrystal particles and the non-perovskite-based quantum dots convert the wavelength of light generated from an excitation light source into different wavelengths, and wherein a mixing ratio of the metal halide perovskite nanocrystal particles and the non-perovskite-based quantum dots is 1:1 to 2:1 by weight.

15. The light-emitting device of claim 14, wherein the wavelength converter further comprises a sealing element for sealing a dispersion medium in which the metal halide perovskite nanocrystal particles and the non-perovskite-based quantum dots are dispersed.

16. The light-emitting device of claim 14, wherein excitation light source is a light-emitting diode or a laser diode, which emits blue light.

17. The light-emitting device of claim 14, wherein the light-emitting device further includes a groove part including a bottom surface on which the excitation light source is to be mounted and a side surface on which a reflective part is formed; and a support part supporting the groove part and having an electrode part electrically connected to the excitation light source.

* * * * *